(12) United States Patent
Kim

(10) Patent No.: US 9,159,384 B2
(45) Date of Patent: Oct. 13, 2015

(54) DATA SENSING CIRCUIT AND MEMORY DEVICE INCLUDING THE SAME

(75) Inventor: Jong-Su Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 309 days.

(21) Appl. No.: 13/604,425

(22) Filed: Sep. 5, 2012

(65) Prior Publication Data

US 2013/0155789 A1    Jun. 20, 2013

(30) Foreign Application Priority Data

Dec. 19, 2011    (KR) .......................... 10-2011-0137619

(51) Int. Cl.
*G11C 7/00* (2006.01)
*G11C 7/12* (2006.01)
*G11C 11/4091* (2006.01)
*G11C 11/4094* (2006.01)

(52) U.S. Cl.
CPC .............. *G11C 7/12* (2013.01); *G11C 11/4091* (2013.01); *G11C 11/4094* (2013.01)

(58) Field of Classification Search
CPC ..... G11C 7/12; G11C 11/4091; G11C 11/4094
USPC .......................... 365/189.11, 203, 189.03, 201
See application file for complete search history.

(56) References Cited

U.S. PATENT DOCUMENTS

2007/0230258 A1 * 10/2007 Kim ........................ 365/189.11

FOREIGN PATENT DOCUMENTS

KR        1020000029643        5/2000

* cited by examiner

*Primary Examiner* — Richard Elms
*Assistant Examiner* — Mohammed A Bashar
(74) *Attorney, Agent, or Firm* — IP & T GROUP LLP

(57) ABSTRACT

An memory device includes a bit line, an NMOS transistor configured to supply a voltage of a pull-up voltage terminal to the bit line in response to a voltage level of the bit line and a PMOS transistor configured to supply a voltage of a pull-down voltage terminal to the bit line in response to the voltage level of the bit line.

11 Claims, 4 Drawing Sheets

US 9,159,384 B2

DATA SENSING CIRCUIT AND MEMORY DEVICE INCLUDING THE SAME

CROSS-REFERENCE TO RELATED APPLICATIONS

The present application claims priority of Korean Patent Application No. 10-2011-0137619, filed on Dec. 19, 2011, which is incorporated herein by reference in its entirety.

BACKGROUND

1. Field

Exemplary embodiments of the present invention relate to a data sensing circuit and a memory device including the same.

2. Description of the Related Art

Memory devices and diverse integrated circuits use a data sensing circuit for sensing data. The data sensing circuit is to sense data even though the data have a small difference between a logic high level and a logic low level thereof and the logic value of the data may not be easily detected.

FIG. 1 is a schematic diagram of a bit line sense amplifier, which is a data sensing circuit used in a conventional memory device.

When a data is read out of a memory cell 101, the voltage level of a bit line BL is changed based on the read data. Since the voltage level change of the bit line BL is very slight, the voltage level of the bit line BL is amplified by a bit line sense amplifier 110. A precharger 120 shown in the drawing is a structure for precharging bit lines BL and /BL to a voltage level of a precharge voltage VBLP before data are loaded on the bit lines BL and /BL.

The bit line sense amplifier 110 may be disposed at the ends of bit lines BL and /BL and formed of a latch circuit for amplifying the voltage difference between a pair of bit lines BL and /BL. The latch circuit includes two inverters 111 and 112. When the bit line sense amplifier 110 performs a data sensing operation, a driving voltage is supplied thereto. For example, a pull-up voltage, which is a power supply voltage VDD or a core voltage VCORE, is supplied to a pull-up voltage supplier RTO, while a pull-down voltage, which is a ground voltage, is supplied to a pull-down voltage supplier SB. Upon receipt of the driving voltage, the inverters 111 and 112 amplifies the voltage difference between the pair of bit lines BL and /BL.

For example, when the voltage level of the positive bit line BL is a little higher than the voltage level of the negative bit line /BL, the bit line sense amplifier 110 makes the positive bit line BL to have the pull-up voltage level and the negative bit line /BL to have the pull-down voltage level. Conversely, when the voltage level of the negative bit line /BL is a little higher than the voltage level of the positive bit line BL, the bit line sense amplifier 110 makes the negative bit line /BL to have the pull-up voltage level and the positive bit line BL to have the pull-down voltage level.

To accurately sense the data loaded on the pair of the bit lines BL and /BL in the bit line sense amplifier 110, PMOS transistors and NMOS transistors that constitute the bit line sense amplifier 110 are to be fabricated all the same. However, it is difficult to fabricate all of the transistors of the bit line sense amplifier 110 to be the same and the transistors may have different characteristics from each other.

Therefore, the conventional bit line sense amplifier 110 has an offset, i.e., a deviation, in operations of the transistors, and technologies such as a method of increasing capacitance of the memory cell 101 or a method of increasing the driving voltage level of the bit line sense amplifier 110 have been used to reduce the offset. However, the method of increasing capacitance of the memory cell 101 may increase the area of the bit line sense amplifier 110, and the method of increasing the driving voltage level of the bit line sense amplifier 110 may increase current consumption.

SUMMARY

An embodiment of the present invention is directed to reducing the area of a data sensing circuit and decreasing an offset in a data sensing circuit.

In accordance with an embodiment of the present invention, an memory device includes: a bit line; an NMOS transistor configured to supply a voltage of a pull-up voltage terminal to the bit line in response to a voltage level of the bit line; and a PMOS transistor configured to supply a voltage of a pull-down voltage terminal to the bit line in response to the voltage level of the bit line.

In accordance with another embodiment of the present invention, an memory device includes: a plurality of memory cells; a plurality of word lines configured to control the memory cells; a plurality of bit lines configured to transfer data of the memory cells; an NMOS transistor provided for each of the bit lines and configured to supply a voltage of a pull-up voltage terminal to a bit line corresponding thereto in response to a voltage level of the corresponding bit line; and a PMOS transistor provided for each of the bit lines and configured to supply a voltage of a pull-down voltage terminal to a bit line corresponding thereto in response to a voltage level of the corresponding bit line.

In accordance with yet another embodiment of the present invention, an memory device includes: a data line; an NMOS transistor configured to supply a voltage of a pull-up voltage terminal to the data line in response to a voltage level of the data line; and a PMOS transistor configured to supply a voltage of a pull-down voltage terminal to the data line in response to a voltage level of the data line.

DETAILED DESCRIPTION

Figure 1:
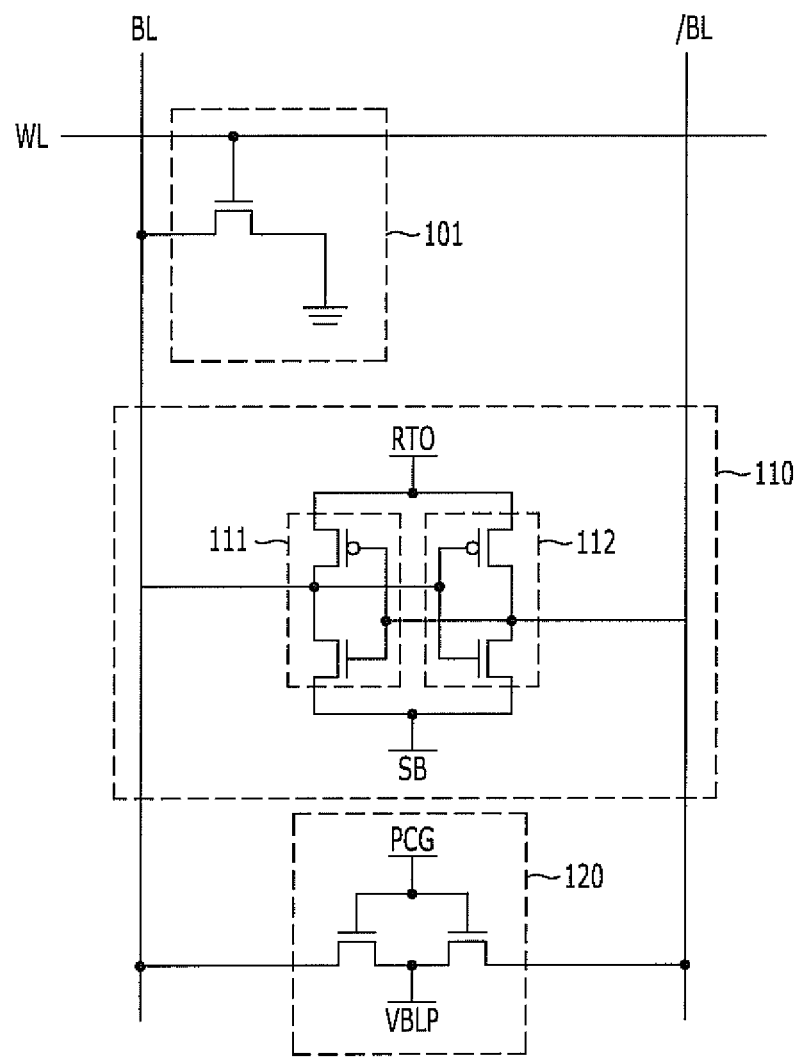
FIG. 1 is a schematic diagram of a bit line sense amplifier, which is a data sensing circuit used in a conventional memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
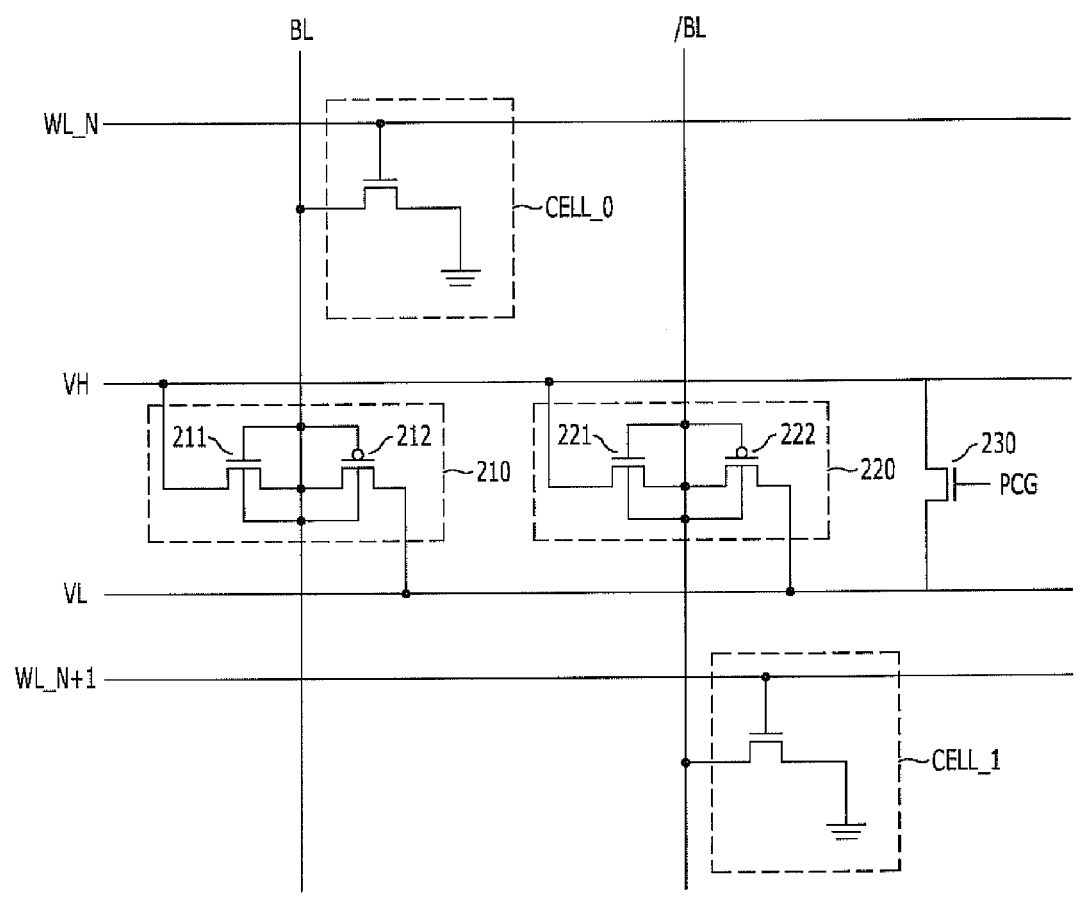
FIG. 2 is a schematic diagram of a data sensing circuit in accordance with an embodiment of the present invention.

FIG. 2 is a schematic diagram of a data sensing circuit in accordance with an embodiment of the present invention. The drawing shows an example that a data sensing circuit senses data of bit lines in a memory device.

Referring to FIG. 2, the memory device includes a plurality of memory cells CELL_0 and CELL_1, a plurality of word lines WL_N and WL_N+1, a plurality of bit lines BL and /BL, and data sensing circuits 210 and 220 that are respectively employed by the bit lines BL and /BL.

Each of the memory cells CELL_0 and CELL_1 includes one transistor and one capacitor. The capacitor stores a data, and the transistor electrically connects/disconnects the capacitor and the bit lines BL and /BL under the control of the word lines WL_N and WL_N+1.

Each of the data sensing circuits 210 and 220 includes an NMOS transistor and a PMOS transistor. The NMOS transistors 211 and 221 are turned on when the voltages of the bit lines BL and /BL are increased and supply the voltage of a pull-up voltage terminal VH to the bit lines BL and /BL. The PMOS transistors 212 and 222 are turned on when the voltages of the bit lines BL and /BL are decreased and supply the voltage of a pull-down voltage terminal VL to the bit lines BL and /BL.

When the data sensing circuits 210 and 220 performs a sensing operation, a pull-up voltage, which is generally a power supply voltage VDD or core voltage VCORE, is supplied to the pull-up voltage terminal VH, and a pull-down voltage, which is generally a ground voltage VSS, is supplied to the pull-down voltage terminal VL. When the bit lines BL and /BL perform a precharge operation, a precharge voltage VBLP, which is an intermediate level voltage between the pull-up voltage and pull-down voltage, is supplied to the pull-up voltage terminal VH and the pull-down voltage terminal VL, and the pull-up voltage terminal VH and the pull-down voltage terminal VL are electrically connected by a switch 230.

During the sensing operation that is performed to sense the data of the bit lines BL and /BL, the data sensing circuits 210 and 220 supply the pull-up voltage from the pull-up voltage terminal VH to the bit lines BL and /BL through the NMOS transistors 211 and 221 when the voltages of the bit lines BL and /BL are increased. When the voltages of the bit lines BL and /BL are decreased, the data sensing circuits 210 and 220 supply the pull-down voltage from the pull-down voltage terminal VL to the bit lines BL and /BL through the PMOS transistors 212 and 222. In short, the data sensing circuits 210 and 220 amplify the data of the bit lines BL and /BL.

Although FIG. 2 illustrates a small number of bit lines, cell array, and data sensing circuits, it is obvious that an actual memory device may include hundreds and thousands of bit lines, cell arrays, and data sensing circuits.

The data sensing circuits 210 and 220 in accordance with the embodiment of the present invention are provided to the bit lines BL and /BL, respectively, and amplify the data of the bit lines BL and /BL. The amplified data obtained in the data sensing circuits 210 and 220 may be amplified again in a differential amplifier disposed at the end of a data transfer path. The differential amplifier is generally referred to as an IOSA and it is not illustrated in the drawing.

Figure 3:
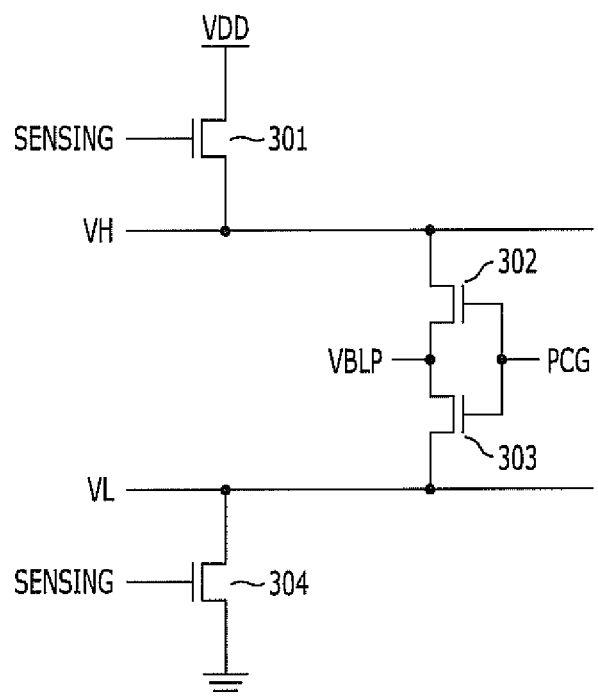
FIG. 3 is a schematic diagram illustrating a circuit for supplying voltages to a pull-up voltage terminal VH and a pull-down voltage terminal VL.
Figure 4:
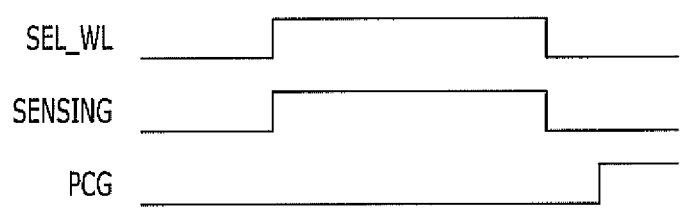
FIG. 4 is a timing diagram of the signals SENSING and PCG shown in FIGS. 2 and 3.

FIG. 3 is a schematic diagram illustrating a circuit for supplying voltages to the pull-up voltage terminal VH and the pull-down voltage terminal VL. FIG. 4 is a timing diagram of the signals SENSING and PCG shown in FIGS. 2 and 3.

Referring to FIG. 3, a pull-up voltage, which is denoted with VDD, is supplied to the pull-up voltage terminal VH through a transistor 301 and a precharge voltage VBLP, which is a ½×VDD, is supplied to the pull-up voltage terminal VH through a transistor 302. Also, a pull-down voltage, which is denoted with VSS, is supplied to the pull-down voltage terminal VL through a transistor 304 and a precharge voltage VBLP, which is a ½×VDD, is supplied to the pull-down voltage terminal VL through a transistor 303.

The transistor 301 and the transistor 304 are turned on in response to a sensing signal SENSING, while the transistor 302 and the transistor 303 are turned on in response to a precharge signal PCG.

Referring to FIG. 4, the sensing signal SENSING is activated as soon as a signal SEL_WL of a selected word line, which is the word line selected based on an address when an active operation is performed, is activated. When the sensing signal SENSING is activated, the pull-up voltage VDD is supplied to the pull-up voltage terminal VH and the pull-down voltage VSS is supplied to the pull-down voltage terminal VL. When the pull-up voltage VDD is supplied to the pull-up voltage terminal VH and the pull-down voltage VSS is supplied to the pull-down voltage terminal VL, the data sensing circuits 210 and 220 perform a sensing operation. Since the data sensing circuits 210 and 220 in accordance with the embodiment of the present invention are activated simultaneously with selecting the word line SEL_WL, it helps charge sharing between the memory cells CELL_0 and CELL_1 and the bit lines BL and /BL. Since the data sensing circuits 210 and 220 operate not only after the charge sharing but also during the charge sharing, the data sensing circuits 210 and 220 have improved sensing margin.

The sensing signal SENSING and the signal of the selected word line SEL_WL being activated simultaneously means that the sensing signal SENSING is activated and a sensing operation is performed even during a charge sharing between the bit lines BL and /BL and the memory cells CELL_0 and CELL_1. In other words, as long as the sensing operation starts before the charge sharing is completed, there may be a slight difference between the moment when the selected word line SEL_WL is activated and the moment when the sensing signal SENSING is activated.

The precharge signal PCG is activated when the bit lines BL and /BL perform a precharge operation. Since the precharge voltage VBLP, which is ½×VDD, is supplied to both of the pull-up voltage terminal VH and the pull-down voltage terminal VL during the precharge operations of the bit lines BL and /BL, the data sensing circuits 210 and 220 help the bit lines BL and /BL perform a precharge operation.

Figure 5:
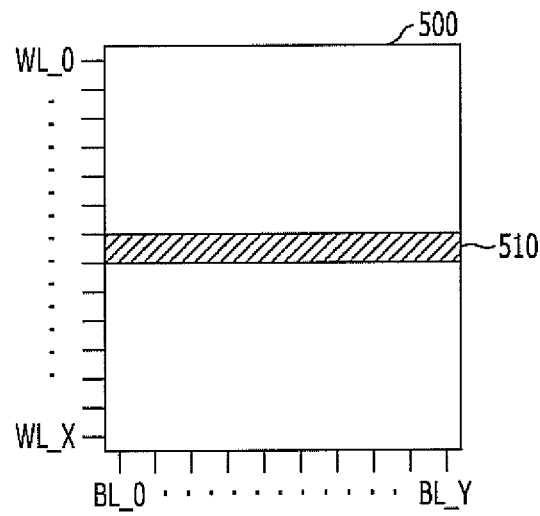
FIG. 5 illustrates the position of a data sensing circuit disposed on a cell array in accordance with an embodiment of the present invention.

FIG. 5 illustrates the position of a data sensing circuit disposed on a cell array, which is simply referred to as a data sensing circuit array 510, in accordance with an embodiment of the present invention.

Referring to FIG. 5, the data sensing circuit array 510, which is an array of the data sensing circuits 210 and 220, may be disposed at the center of a cell array 500. The data sensing circuit array 510 being disposed at the center of the cell array 500 means that memory cells are disposed over and under the data sensing circuit array 510 in a direction that bit lines BL extends. As the data sensing circuit array 510 is disposed at the center of the cell array 500, non-uniform sensing margin depending on the positions of the memory cells in the cell array 500 may be improved.

Since the data sensing circuit array 510 is disposed at the center of the cell array 500, the transistors 211, 212, 221 and 222 that constitute the data sensing circuits 210 and 220 may be fabricated in a similar size to those of the transistors of the memory cells CELL_0 and CELL_1.

The embodiment of the present invention shown in FIG. 5 is different from conventional technology in that the data sensing circuit array 510 of FIG. 5 is disposed at the center of the cell array 500 whereas the conventional data sensing circuit (see FIG. 1) is disposed only at the end of a cell array.

Figure 6:
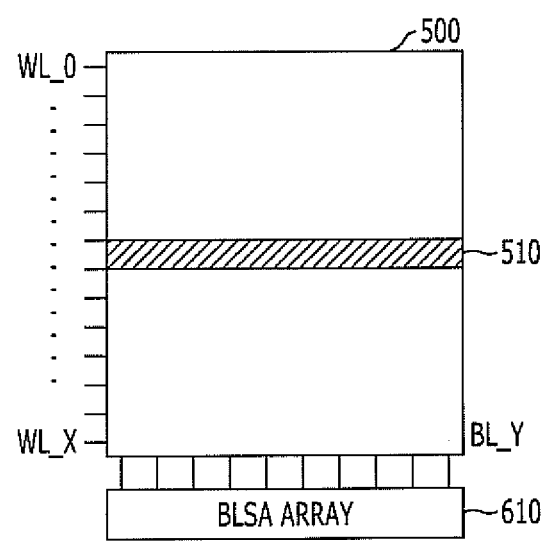
FIG. 6 illustrates a data sensing circuit array according to an embodiment of the present invention and a conventional bit line sense amplifier array, which are disposed together on a cell array.

FIG. 6 illustrates a data sensing circuit array according to an embodiment of the present invention and a conventional bit line sense amplifier array, which are disposed together on a cell array.

The data sensing circuit array 510 in accordance with the embodiment of the present invention may be substituted for a conventional bit line sense amplifier array, but it may be also used together with the conventional bit line sense amplifier array 610 (see FIG. 1). In this case, the data sensing circuits amplify data at the center of the cell array 500 and at the end of the cell array 500, the conventional bit line sense amplifier array 610 amplifies data so as to sense data in cooperation. Since the data sensing circuit array 510 amplifies the data at the center of the cell array 500, the size of the cell array 500 covered by the data sensing circuit 510 may be made greater than conventional cell array.

According to an embodiment of the present invention, the offset, area and current consumption of a data sensing circuit are decreased. Particularly, when the data sensing circuit in accordance with an embodiment of the present invention is applied to a memory device, it may help bit lines perform a charge sharing so as to improve sensing margin and it may increase the size of a cell array, functioning favorably to high integration of a memory.

While the present invention has been described with respect to the specific embodiments, it will be apparent to those skilled in the art that various changes and modifications may be made without departing from the spirit and scope of the invention as defined in the following claims.

Also, although the above-described embodiments illustrate a case that the data sensing circuits in accordance with the embodiments of the present invention are used to amplify the data of bit lines in the memory device, it is obvious to those skilled in the art that the data sensing circuits in accordance with the embodiments of the present invention may be used to amplify data in diverse integrated circuits other than the memory device.

What is claimed is:

1. A memory device, comprising:
    a bit line;
    an NMOS transistor including a gate connected to the bit line, wherein one side of drain/source of the NMOS transistor is connected to a pull-up voltage terminal and the other side of drain/source of the NMOS transistor is connected to the bit line; and
    a PMOS transistor including a gate connected to the bit line, wherein one side of drain/source of the PMOS transistor is connected to a pull-down voltage terminal and the other side of drain/source of the PMOS transistor is connected to the bit line.

2. The memory device of claim 1, wherein the NMOS transistor and the PMOS transistor are disposed between at least two memory cells to access data of the memory cells through the bit line.

3. The memory device of claim 1, further comprising:
    a precharging unit configured to supply a same voltage to the pull-up voltage terminal and the pull-down voltage terminal to precharge the bit line during a precharge operation.

4. The memory device of claim 3, wherein a pull-up voltage is supplied to the pull-up voltage terminal and a pull-down voltage is supplied to the pull-down voltage terminal after the precharge operation,
    wherein the level of the same voltage is half the level of the pull-up voltage.

5. A memory device, comprising:
    a plurality of memory cells;
    a plurality of word lines configured to control the multiple memory cells;
    a plurality of bit lines configured to transfer data of the memory cells;
    an NMOS transistor provided for each of the bit lines, wherein a gate of the NMOS transistor is connected to a bit line corresponding thereto, one side of drain/source of the NMOS transistor is connected to a pull-up voltage terminal and the other side of drain/source of the NMOS transistor is connected to the corresponding bit line; and
    a PMOS transistor provided for each of the bit lines, wherein a gate of the PMOS transistor is connected to a bit line corresponding thereto, one side of drain/source of the PMOS transistor is connected to a pull-down voltage terminal and the other side of drain/source of the PMOS transistor is connected to the corresponding bit line.

6. The memory device of claim 5, wherein the NMOS transistor and the PMOS transistor are disposed at a center of the corresponding bit line.

7. The memory device of claim 6, wherein a pull-up voltage is supplied to the pull-up voltage terminal and a pull-down voltage is supplied to the pull-down voltage terminal at a moment when a signal of a selected word line among the word lines is activated.

8. The memory device of claim 7, wherein a same voltage is supplied to the pull-up voltage terminal and the pull-down voltage terminal when the bit lines perform a precharge operation.

9. A memory device, comprising:
    a data line;
    an NMOS transistor including a gate connected to the data line, wherein one side of drain/source of the NMOS transistor is connected to a pull-up voltage terminal and the other side of drain/source of the NMOS transistor is connected to the data line; and
    a PMOS transistor including a gate connected to the data line, wherein one side of drain/source of the PMOS transistor is connected to a pull-down voltage terminal and the other side of drain/source of the PMOS transistor is connected to the data line.

10. The memory device of claim 9, wherein a same voltage is supplied to the pull-up voltage terminal and the pull-down voltage terminal when a data is loaded on the data line.

11. The memory device of claim 9, wherein a pull-up voltage is supplied to the pull-up voltage terminal and a pull-down voltage is supplied to the pull-down voltage terminal as soon as a data is loaded on the data line.

* * * * *